(12) United States Patent
Tokuhara

(10) Patent No.: US 7,768,124 B2
(45) Date of Patent: Aug. 3, 2010

(54) SEMICONDUCTOR SENSOR HAVING A FLAT MOUNTING PLATE WITH BANKS

(75) Inventor: Minoru Tokuhara, Okazaki (JP)

(73) Assignee: DENSO CORPORATION, Kariya (JP)

( * ) Notice: Subject to any disclaimer, the term of this patent is extended or adjusted under 35 U.S.C. 154(b) by 248 days.

(21) Appl. No.: 12/068,264

(22) Filed: Feb. 5, 2008

(65) Prior Publication Data
US 2008/0197481 A1 Aug. 21, 2008

(30) Foreign Application Priority Data
Feb. 16, 2007 (JP) ............... 2007-036538
Aug. 31, 2007 (JP) ............... 2007-226235

(51) Int. Cl.
*H01L 23/053* (2006.01)
(52) U.S. Cl. ............... 257/730; 257/E23.188
(58) Field of Classification Search ............ 257/678, 257/684, 687, 690, 698, 701–704, 723–725, 257/730–732, E23.181, E23.183, E23.184, 257/E23.188, E23.19
See application file for complete search history.

(56) References Cited

U.S. PATENT DOCUMENTS 6,747,346 B2 6/2004 Saito et al.
7,091,580 B2 8/2006 Akagawa et al.
7,253,613 B2 8/2007 Tokuhara
2006/0097717 A1 * 5/2006 Tokuhara et al. ........ 324/207.25
2007/0228535 A1 * 10/2007 Fujino et al. ................ 257/678

FOREIGN PATENT DOCUMENTS

| JP | B2-2850797 | 1/1997 |
| JP | Y2-2598149 | 5/1999 |
| JP | A-2007-040965 | 2/2007 |

* cited by examiner

*Primary Examiner*—Matthew C Landau
*Assistant Examiner*—Daren Wolverton
(74) *Attorney, Agent, or Firm*—Posz Law Group, PLC

(57) ABSTRACT

A semiconductor sensor is contained in a cylindrical housing, an opening of which is closed with a cover member. The cover member includes a mounting plate integrally molded therewith. Components including a bare sensing chip and other circuit chips are directly mounted on a flat surface of the mounting plate. The components mounted on the flat surface are covered with gel having a high flowability. The gel is prevented from flowing out of the flat surface toward the cover member by banks formed at both sides of the flat surface. On an inner wall of the bank, curved surfaces and depressions are formed to surely suppress creeping up of the gel and to trap the gel therein if it creeps up the inner wall of the bank. Thus, the gel is surely prevented from flowing out even though the banks do not entirely surround the flat mounting surface.

10 Claims, 13 Drawing Sheets

COMPARATIVE EXAMPLE

COMPARATIVE EXAMPLE

COMPARATIVE EXAMPLE

COMPARATIVE EXAMPLE

COMPARATIVE EXAMPLE

SEMICONDUCTOR SENSOR HAVING A FLAT MOUNTING PLATE WITH BANKS

CROSS-REFERENCE TO RELATED APPLICATION

This application is based upon and claims benefit of priority of Japanese Patent Applications No. 2007-36538 filed on Feb. 16, 2007 and No. 2007-226235 filed on Aug. 31, 2007, the contents of which are incorporated herein by reference.

BACKGROUND OF THE INVENTION

1. Field of the Invention

The present invention relates to a semiconductor sensor such as a rotational speed detector.

2. Description of Related Art

An example of a semiconductor sensor having a mounting plate on which a sensing chip is mounted is disclosed in JP-A-2006-132978. In this semiconductor sensor, the sensor is unitarily packaged, and signals are led out through terminals extending from the packaged sensor. Generally, a sensing chip of a semiconductor sensor is packaged in a can, or integrally molded with resin thereby to reduce the manufacturing cost. To further reduce the manufacturing cost, a method for mounting a sensing chip in a bare chip state is being utilized these days. In this bare chip mounting method, the following problem is involved.

Gel used for covering and protecting the bare chip mounted on a mounting surface has high flowability until it is cured. Accordingly, the gel flows out to reach other portions where components are connected with adhesive, causing deterioration in connecting strength. To cope with this problem, it has been proposed to form banks for preventing the gel from flowing out around a surface for mounting the bare chips. However, a size of the semiconductor sensor becomes large by forming the banks surrounding the mounting surface, causing increase in the manufacturing cost.

SUMMARY OF THE INVENTION

The present invention has been made in view of the above-mentioned problem, and an object of the present invention is to provide an improved semiconductor sensor, in which gel covering bare chips is effectively prevented from flowing out by making banks at both sides of a flat mounting surface.

A sensing chip in a bare chip state is mounted on a flat mounting surface of a mounting plate together with other circuit chips and components. Those semiconductor chips and components mounted on the flat mounting surface are covered with gel having high flowability. The mounting plate is integrally molded with a cover member having terminals extending therefrom. A cylindrical housing having an opening is prepared, and the opening is closed with the cover member having the mounting plate after the components are mounted and covered with the gel. Thus, the sensing chips and other components are contained in the cylindrical housing.

To prevent the gel covering the components mounted on the flat mounting surface from flowing out of the flat mounting surface, banks are formed at both sides of the flat mounting plate. The banks are formed only at portions close to the cover member without entirely surrounding the flat mounting surface. On an inner wall of the bank, curved concave surfaces (curved surfaces in a depressed form) are formed, and depressed portions having perpendicular surfaces are formed on the inner wall of the bank at a portion opposite to the cover member. Preferably, the inner wall of the bank is formed to have a flat step at its middle portion.

Although the gel has high flowability before it is cured, the gel is prevented from flowing out of the flat mounting surface by the banks. In particular, the gel is prevented from creeping up the bank due to its capillary action by the curved concave surfaces. Further, the gel is trapped in the depressed portions and the step formed on the inner wall of the bank. Thus, the gel is prevented from flowing out toward the cover member. If the gel reaches a portion of the cover member connected to the opening of the cylindrical housing with adhesive, a connecting force of the adhesive would be decreased.

A groove may be additionally formed on an upper surface of the bank to trap the gel therein. Further, a groove or grooves may be formed on an outer wall of the bank to trap the gel therein in case the gel flows out over the bank. Preferably, a parting line of a molding die for molding the mounting plate integrally with the cover member is formed a certain distance apart from the flat mounting surface thereby to avoid creeping of the gel along the parting line.

According to the present invention, the gel having high flowability is prevented from flowing out of the flat mounting surface by forming banks only at portions close to the cover member, without making the mounting plate large in size. Other objects and features of the present invention will become more readily apparent from a better understanding of the preferred embodiment and its modified forms described below with reference to the following drawings.

DETAILED DESCRIPTION OF THE PREFERRED EMBODIMENT

A preferred embodiment of the present invention will be described with reference to FIGS. 1-10. A semiconductor sensor as a preferred embodiment is a sensor for detecting a rotational speed. A sensing chip and other processing circuits are contained in a housing, and signals representing rotational speed are taken out from terminals extending from the housing.

Figure 4:
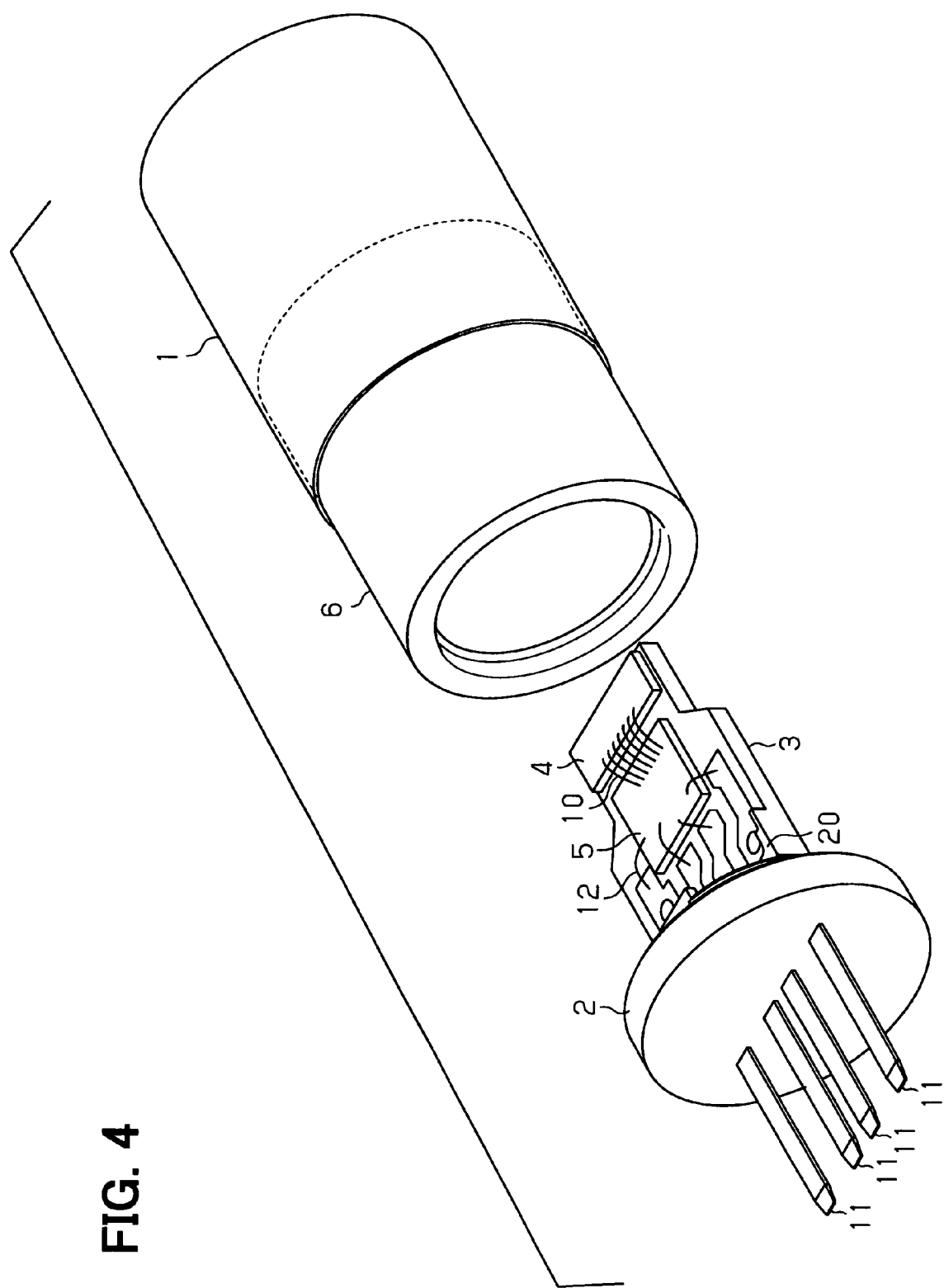
FIG. 4 is an exploded perspective view showing the same semiconductor sensor.

As shown in FIG. 4 that shows the semiconductor sensor in an exploded manner, the semiconductor sensor is composed of a cylindrical housing 1, a magnet 6 for giving a biasing magnetic field, a cover member 2 for closing an open end of the cylindrical housing 1 and a mounting plate 3 connected to the cover member 2. Various components forming the semiconductor sensor are mounted on the mounting plate 3, and terminals 11 for outputting signals and for supplying power to the components are extended from the cover member 2.

Figure 2:
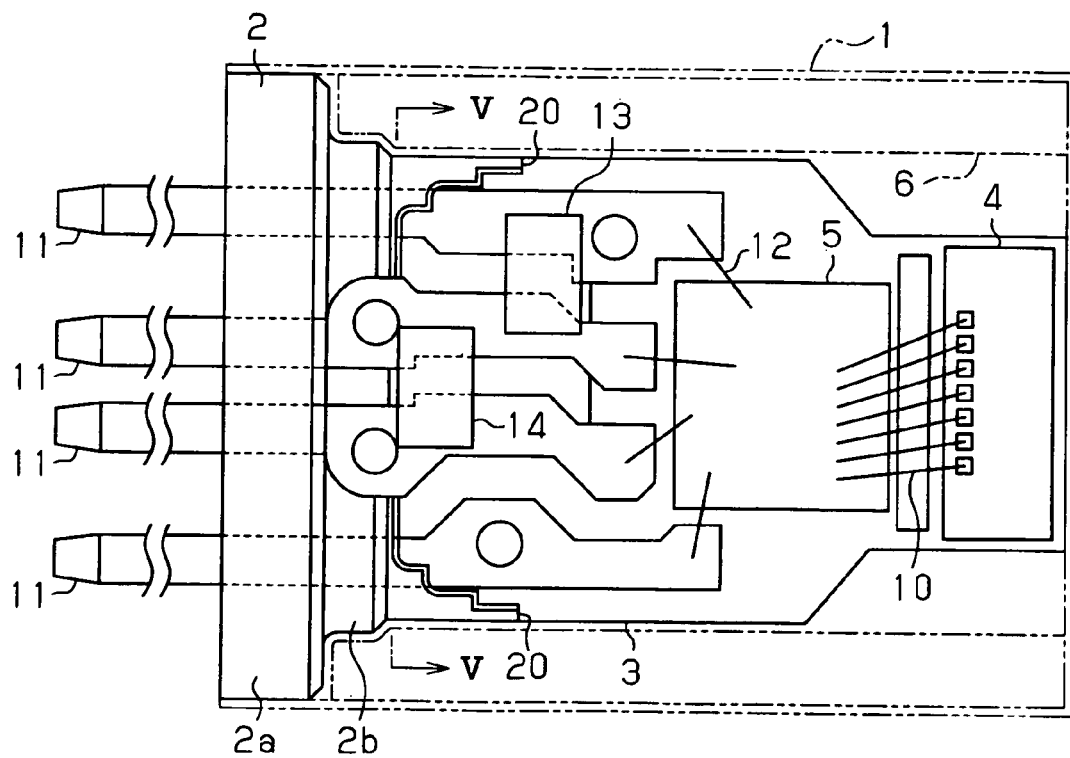
FIG. 2 is a plan view showing the semiconductor sensor shown in FIG. 1, with a housing and a biasing magnet removed.
Figure 3:
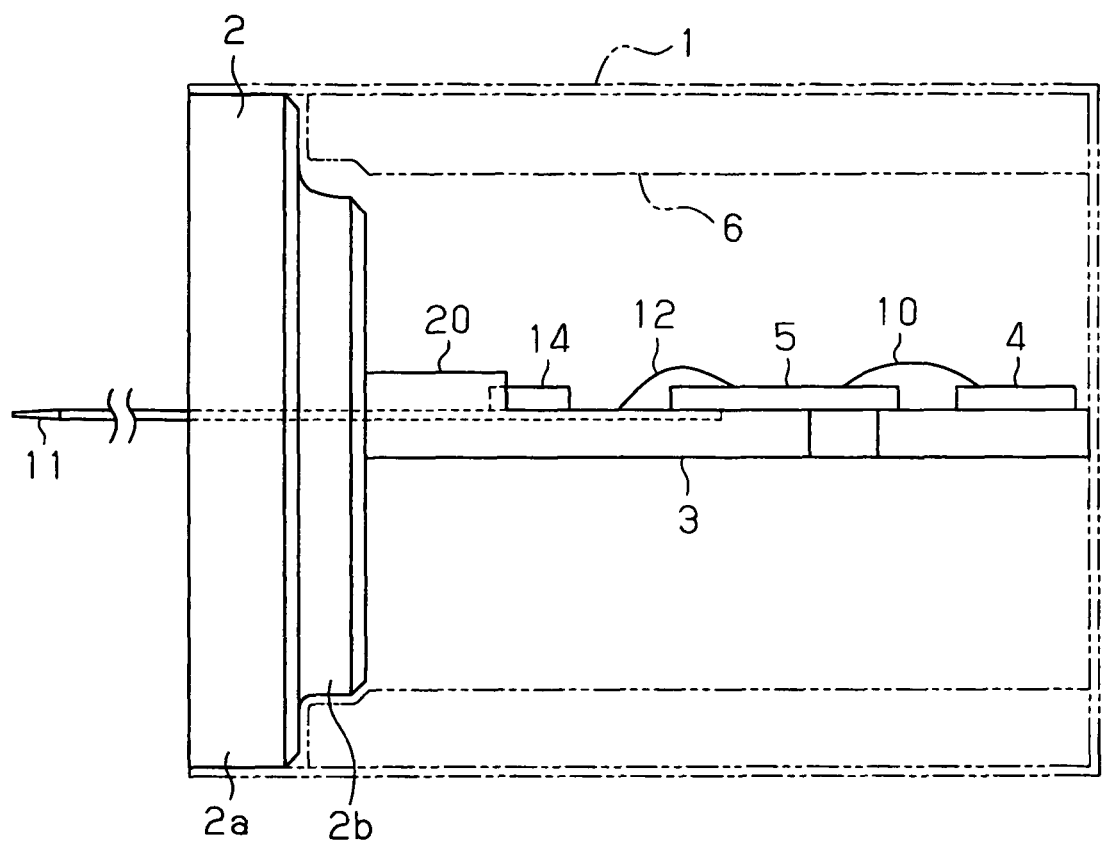
FIG. 3 is a side view showing the same semiconductor sensor, with a housing and a biasing magnet removed.

The cylindrical housing 1 is made of a non-magnetic material such as resin or ceramics. One end of the cylindrical housing 1 is closed and the other end thereof is opened. The open end is closed with the cover member 2. The cover member 2 has a large diameter portion 2a and a small diameter portion 2b, as shown in FIGS. 2 and 3. An outer periphery of the large diameter portion 2a is coupled to an inner bore of the cylindrical housing 1 at its opening and connected thereto with adhesive such as epoxy resin or silicone resin. The mounting plate 3 having a flat mounting surface is made of resin integrally with the cover member 2. The mounting plate 3 is contained in the cylindrical housing 1 by connecting the cover member 2 to the opening of the cylindrical housing 1.

As better seen in FIG. 2, a sensing chip 4 having a magnetoresistive element is mounted on a tip portion of the flat surface of the mounting plate 3 in a bare chip state. A circuit chip 5 including a signal processor is mounted on the flat mounting surface. Both chips 4, 5 are connected to the flat mounting surface with adhesive. The sensing chip 4 is electrically connected to the circuit chip 5 through bonding wires 10. The circuit chip 5 amplifies (differential amplification) output signals of the sensing chip 4 and digitalizes the output signals.

Four terminals 11 are insert-molded together with the cover member 2. One end of each terminal extends outside from the cover member 2, and the other end thereof is exposed on the mounting plate 3 and electrically connected to the circuit chip 5 through bonding wires 12. The four terminals 11 respectively function as a terminal for supplying power, a ground terminal, an output terminal and an adjusting terminal. As shown in FIG. 2, a chip capacitor 13 is connected between the power terminal and the ground terminal exposed on the mounting plate 3 with conductive adhesive. Another chip capacitor 14 is connected between the output terminal and the grounding terminal exposed on the mounting plate 3 with conductive adhesive.

Figure 1:
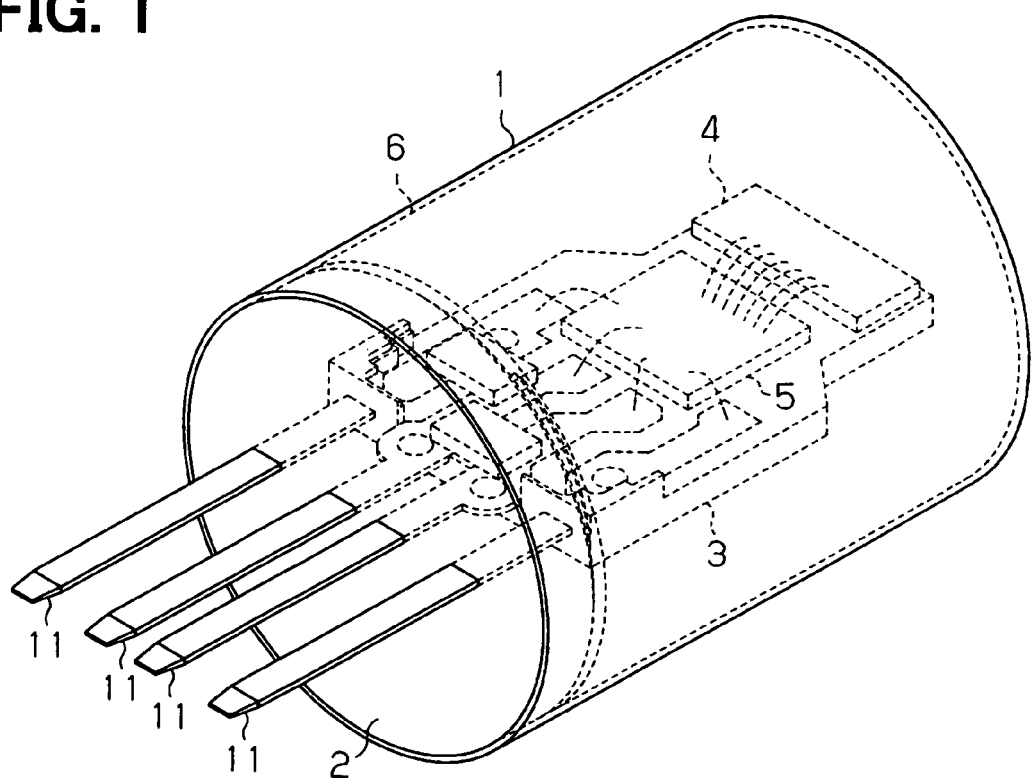
FIG. 1 is a perspective view showing a semiconductor sensor according to the present invention.

The biasing magnet 6 formed in a cylindrical shape is connected to the inner bore of the cylindrical housing 1, as shown in FIG. 1. The biasing magnet 6 provides a biasing magnetic filed to the magnetoresistive element of the sensing chip 4 which is disposed in the biasing magnet 6. The sensing chip 4 is positioned to face a rotor, and changes in a magnetic vector composed of the biasing magnetic field and a magnetic field of the rotor are detected as changes in a resistance of the magnetoresistive element. Thus, a rotational speed of the rotor is detected.

Figure 8:
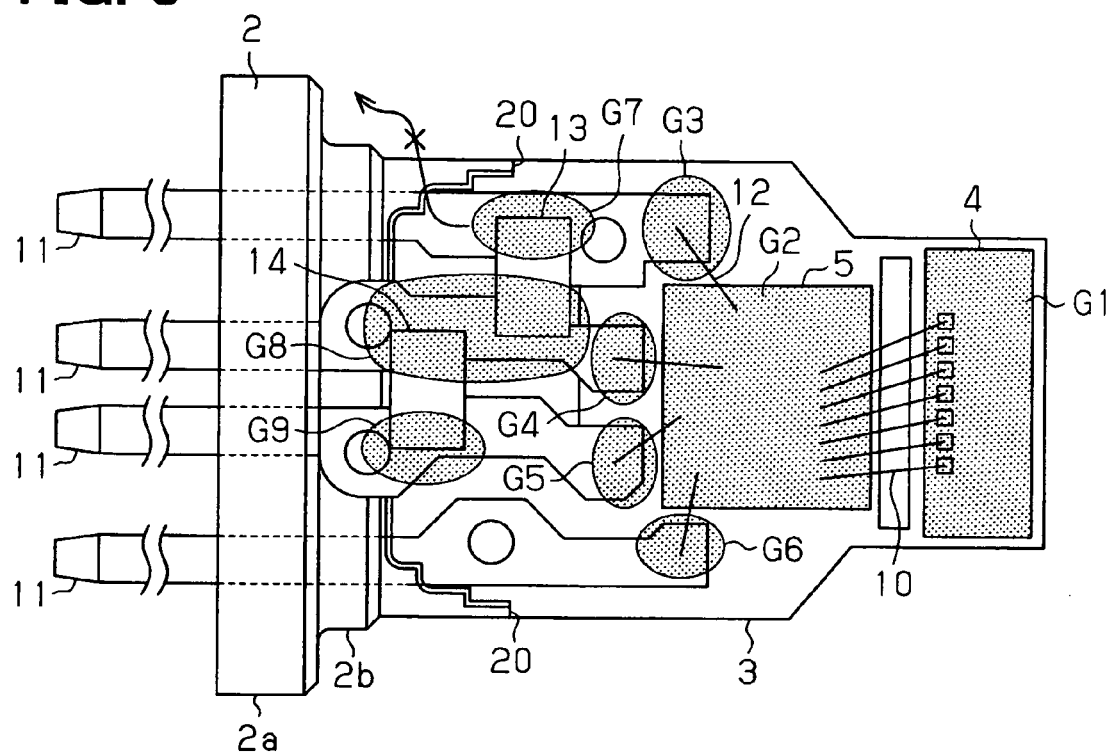
FIG. 8 is a plan view showing the mounting plate on which gel is applied to cover and protect bare chips mounted on the mounting plate.
Figure 9:
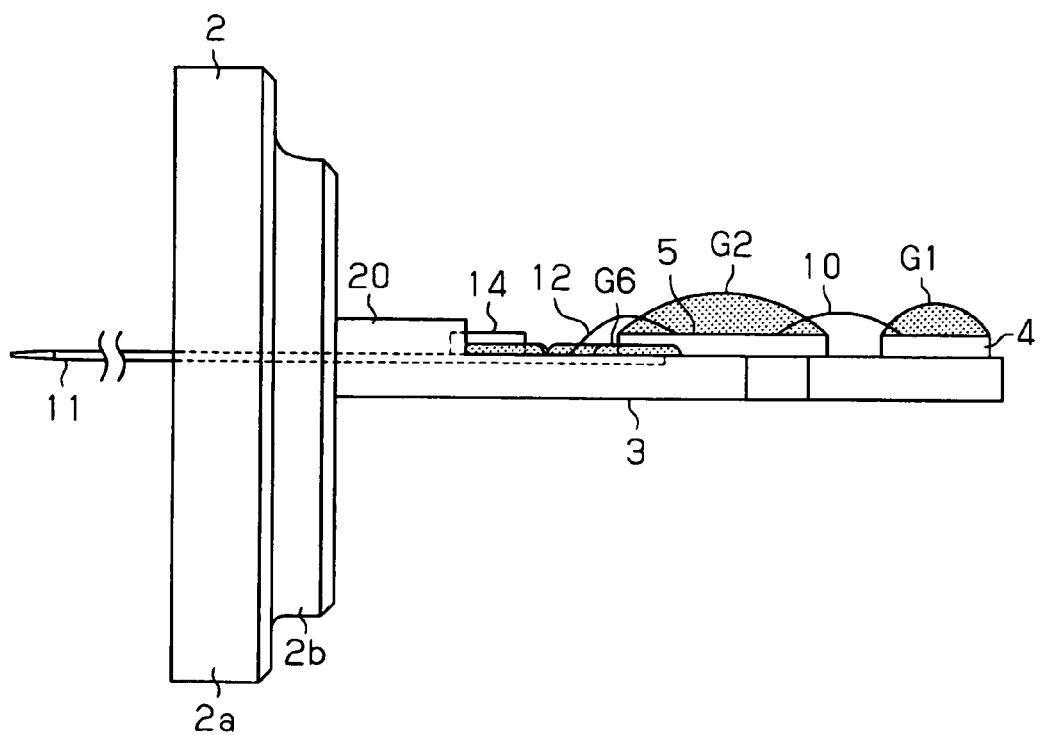
FIG. 9 is a side view showing the same mounting plate on which gel is applied.

As shown in FIGS. 8 and 9, gel G1-G9 is disposed on the mounting surface to cover and protect components mounted on the mounting surface. Gel G1 covers the sensing chip 4, gel G2 covers the circuit chip 5, gel G3-G6 cover connecting portions of the bonding wires 12, and gel G7-G9 cover electrode portions of the chip capacitors 13, 14. Thus, upper surfaces of the chips 4, 5, bonded portions and electrode portions are protected by the gel from any conductive particles or contaminants. The gel has high flowability before it is cured, and it maintains certain plasticity after it is cured.

Figure 5:
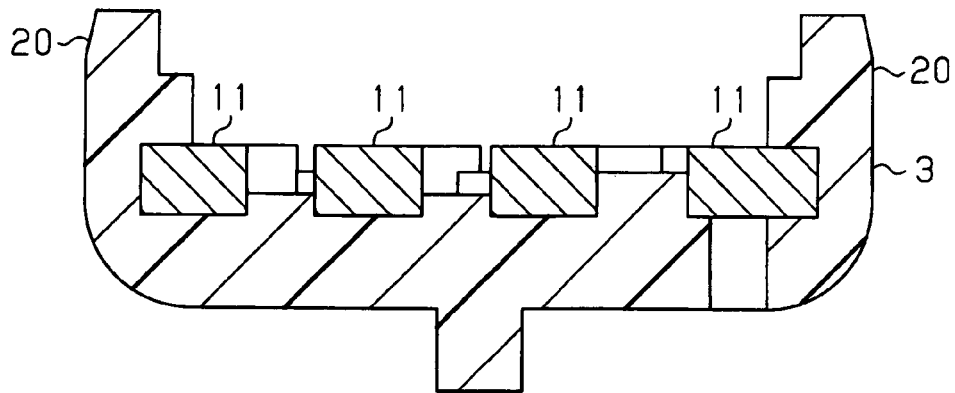
FIG. 5 is a cross-sectional view showing the same semiconductor sensor, taken along line V-V shown in FIG. 2.
Figure 6A:
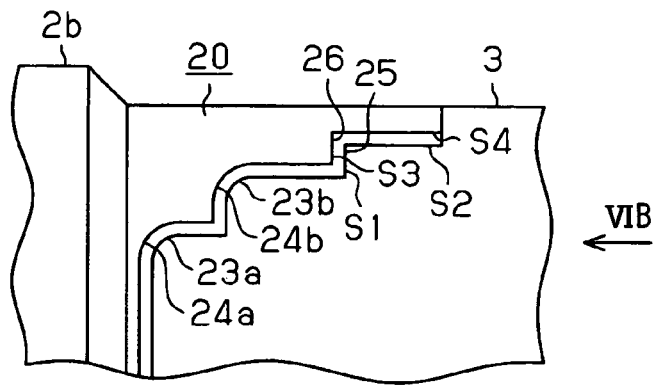
FIG. 6A is a partial plan view showing a bank formed on a mounting plate of the semiconductor sensor.
Figure 6B:
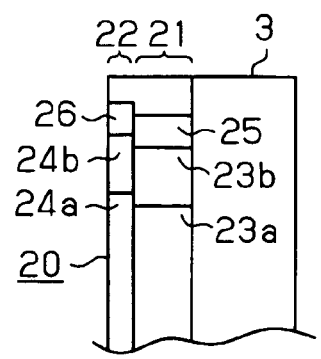
FIG. 6B is a partial side view showing the bank viewed in a direction VIB shown in FIG. 6A.

As shown in FIGS. 2 and 5, banks 20 for preventing the gel from flowing out are formed on the flat surface of the mounting plate 3 at both sides thereof. Details of the bank are shown in FIG. 6A (a plan view), FIG. 6B (a side view viewed in a direction VIB shown in FIG. 6A) and FIG. 7 (a perspective view) As better seen in FIG. 7, an inner wall of the bank 20 has a step structure having a lower wall 21 and an upper wall 22. A step is formed between the lower wall 21 and the upper wall 22. Curved surfaces 23a, 23b (in a depressed form) are formed on the lower wall 21, and similarly, curved surfaces 24a, 24b (in a depressed form) are formed on the upper wall 22.

Further, at an end portion of the bank 20 (opposite to the cover member 2), a depressed portion 25 is formed on the lower wall 21 and another depressed portion 26 is formed on the upper wall 22. The depressed portion 25 has walls S1 and S2, perpendicular to each other, and the depressed portion 26 has walls S3 and S4, perpendicular to each other.

A method of manufacturing the semiconductor sensor described above will be briefly explained. The biasing magnet 6 is inserted into the cylindrical housing 1 and connected thereto. Components including the sensing chip 4 and the circuit chip 5 are mounted on the flat surface of the mounting plate 3 which is integrally formed with the cover member 2. Electrical connections between the components and terminals 11 are made through the bonding wires 10, 12. Then, the gel G1-G9 is dropped on the components mounted on the mounting plate 3 to cover and protect them. Finally, the cover member 2 is connected with adhesive to the cylindrical housing 1 to close its opening. The cover member 2 may be connected to the cylindrical housing by laser welding in place of the adhesive.

Figure 16:
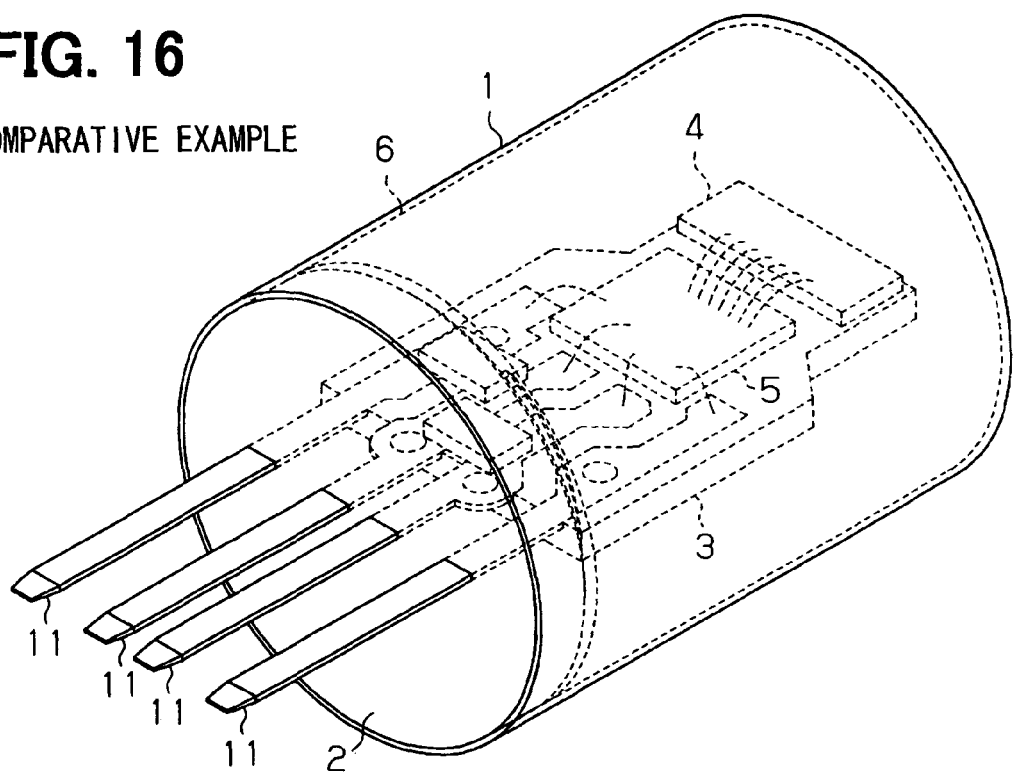
FIG. 16 is a perspective view showing a comparative example of the semiconductor sensor.
Figure 17:
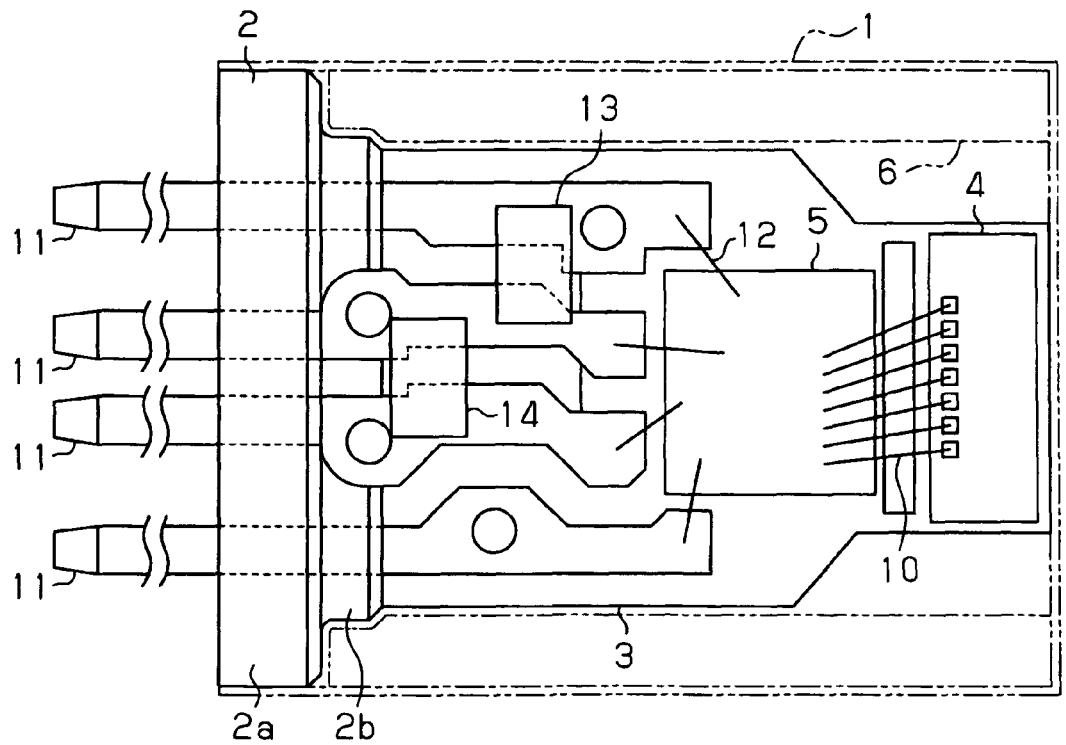
FIG. 17 is a plan view showing the comparative example shown in FIG. 16.
Figure 18:
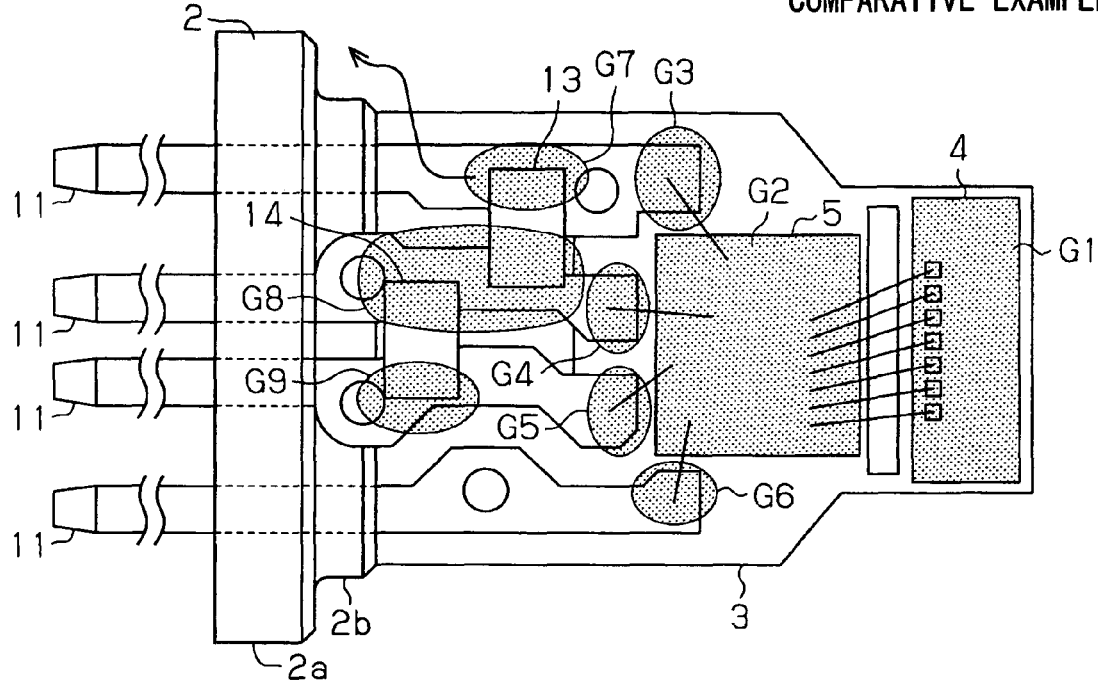
FIG. 18 is a plan view showing the comparative example on which gel is applied.

A comparative example of a semiconductor sensor is shown in FIGS. 16, 17 and 18, which correspond to FIGS. 1, 2 and 8, respectively. In this comparative example, the bank 20 for preventing the gel from flowing out is not formed. Since the gel has high flowability before it is cured, it spreads over the flat surface of the mounting plate 3 and creeps up to the small diameter portion 2b of the cover member 2, as shown with an arrow in FIG. 18. The gel creeps up a step having a height of 4 mm, especially at edge portions, due to the capillary action of the gel. The gel flowed out to the small diameter portion 2b of the cover member 2 adversely affects adhesive strength between the cylindrical housing 1 and the cover member 2.

Figure 7:
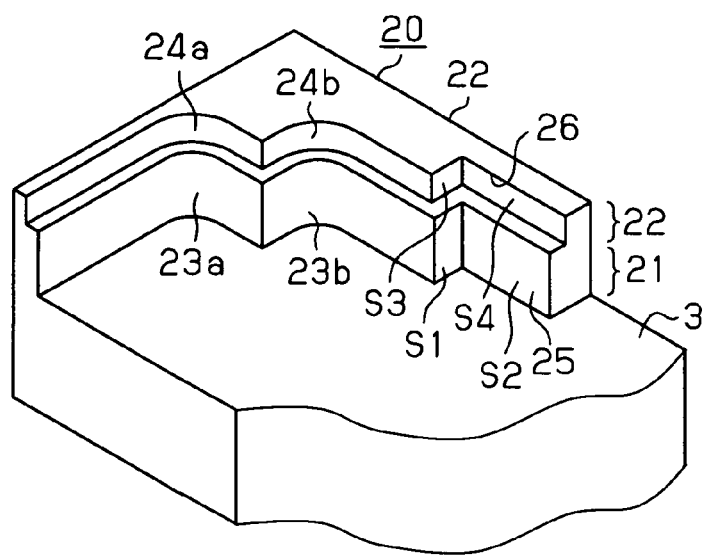
FIG. 7 is a partial perspective view showing the bank formed on the mounting plate.
Figure 10:
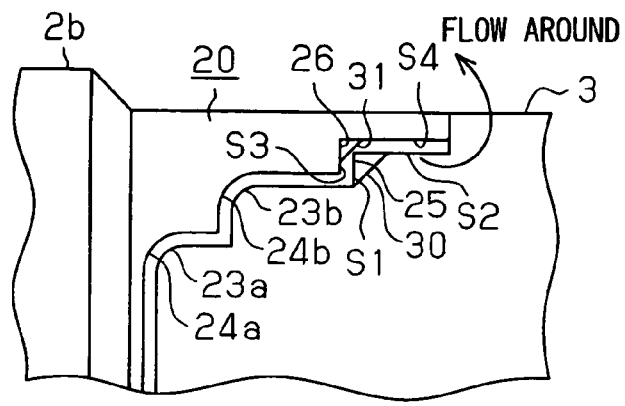
FIG. 10 is a partial plan view showing the bank and depressed portions formed in the bank for preventing the gel from flowing out.

In order to prevent the gel from flowing out, the banks 20 are formed at both sides of the flat mounting surface in the embodiment of the present invention described above. Further, as shown in FIG. 7, curved surfaces 23a, 23b, 24a, 24b are formed on the inner wall of the bank 20. These curved surfaces reduce the capillary action of the gel by about 50 percents. Thus, the gel is prevented from flowing out beyond the banks 20. In addition, the depressed portions 25, 26 are formed to provide edges between the perpendicular surfaces (S1, S2, S3, S4) forming the depressed portions. As shown in FIG. 10, the gel 30, 31 is trapped at the edges formed by the depressed portions 25, 26. In this manner, the gel is prevented from flowing out of the banks 20.

The advantages attained in the embodiment described above will be summarized as below. The gel having high flowability is prevented from flowing out of the flat surface of the mounting plate 3 by making banks 20 only at portions close to the small diameter portion 2b that is to be connected to the cylindrical housing 1. In other words, the gel is prevented from flowing out without making a bank fully surround the mounting surface. Accordingly, it is not necessary to increase the size of the mounting plate 3 for making the bank. The above advantages are surely attained by forming the curved surfaces 23a, 23b, 24a, 24b and the depressed portions 25, 26 on the inner surface of the banks 20. The curved surfaces prevent creeping up of the gel, and the depressed portions formed at the end of the bank 20 trap the gel at their edges.

The step structure of the inner wall having the lower wall 21 and the upper wall 22 also helps alleviate the creeping-up of the gel. However, the step structure of the inner wall of the bank 20 may be changed to two-step structure, i.e., to the inner wall having lower, intermediate and upper walls. The step may be eliminated if the gel is sufficiently prevented from flowing out in a certain application.

Figure 11:
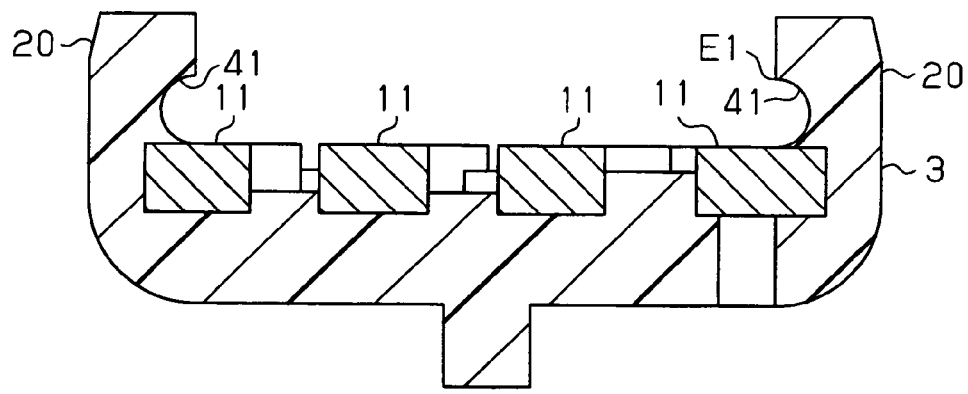
FIG. 11 is a cross-sectional view showing a modified form 1 of the present invention.
Figure 12:
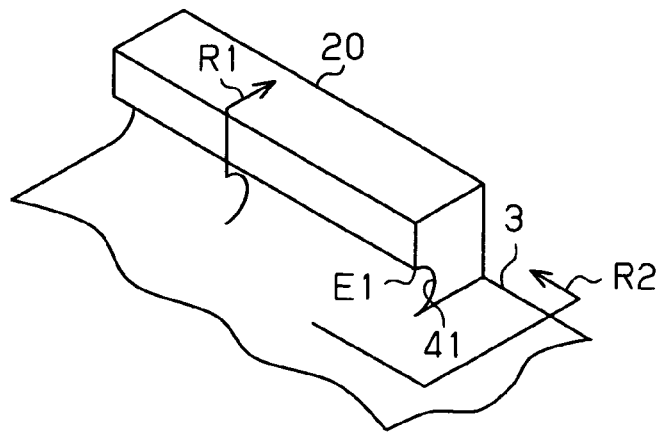
FIG. 12 is a partial perspective view showing the modified form 1, explaining passages of the gel flowing out of the mounting plate.

The present invention is not limited to the embodiment described above, but it may be variously modified. A modified form 1 is shown in FIGS. 11 and 12, which correspond to FIGS. 5 and 7, respectively. In this modified form 1, grooves 41 having a curved surface are formed at a foot of the banks 20. Creeping-up of the gel along a passage R1 shown in FIG. 12 is prevented by the grooves 41. In this case, the gel is stopped at edges E1. However, the gel may flow around the bank 20 along a passage R2 shown in FIG. 12. To prevent the gel from flowing along the passage R2, it is preferable to additionally form the structures described above, such as the curved surfaces, the step and/or the depressions.

Figure 13:
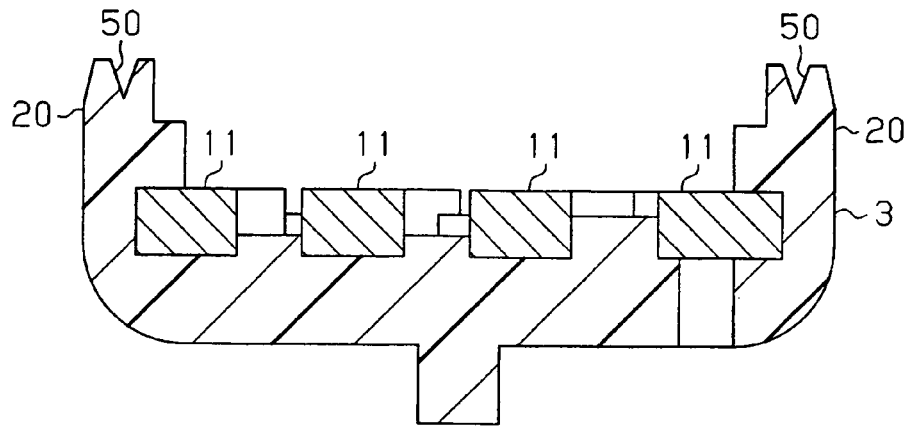
FIG. 13 is a cross-sectional view showing a modified form 2 that includes a V-shaped groove formed on an upper wall of the bank.
Figure 14:
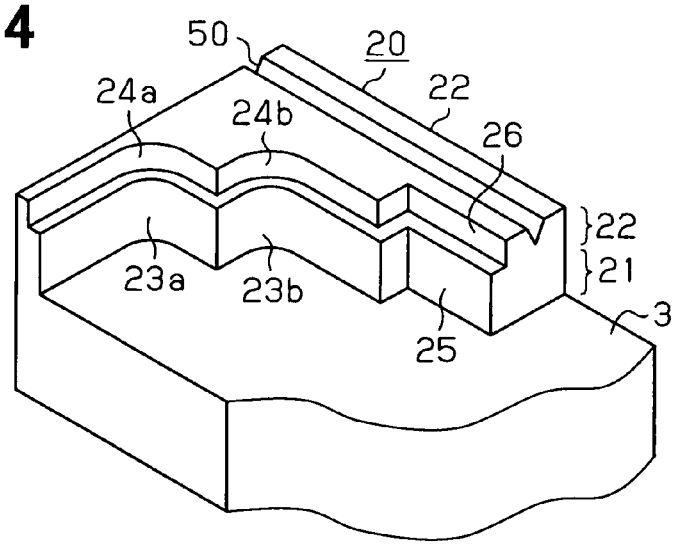
FIG. 14 is a partial perspective view showing the modified form 2 shown in FIG. 13.
Figure 15A:
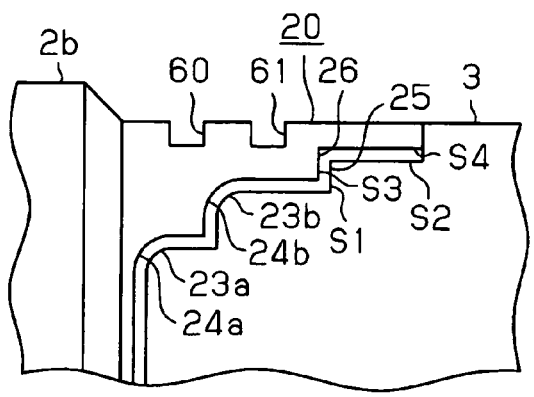
FIG. 15A is a partial plan view showing a modified form 3 that includes grooves formed on an outer wall of the bank.
Figure 15B:
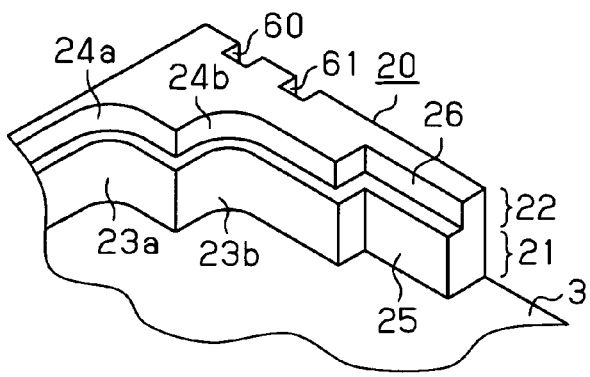
FIG. 15B is a partial perspective view showing the modified form 3 shown in FIG. 15A.

FIGS. 13 and 14, corresponding to FIGS. 5 and 7, respectively, show a modified form 2. In this modified form, a V-shaped groove 50 is formed on the upper surface of the bank 20. The gel is trapped in the V-shaped groove 50 thereby to prevent flowing-out of the gel. FIGS. 15A and 15B, corresponding to FIGS. 6A and 7, respectively, show a modified form 3. In this modified form, grooves 60, 61 are formed on the outer wall of the bank 20. The gel is prevented from flowing out of the mounting plate 3 because it is trapped in the grooves 60, 61.

Though the various structures are formed on the bank 20 in the foregoing embodiment and modified forms for preventing the gel covering the components mounted on the mounting plate 3 from flowing out of the mounting plate, the same structures may be used for preventing adhesive (such as silicone or epoxy adhesives) from flowing out. For example, when the chip capacitors 13, 14 are connected to the mounting flat surface with flowable adhesive, the same structures mentioned above may be used for preventing the adhesive from flowing out. Application of the present invention is not limited to the sensor for detecting rotational speed, but it may be applied to other sensors.

Figure 19:
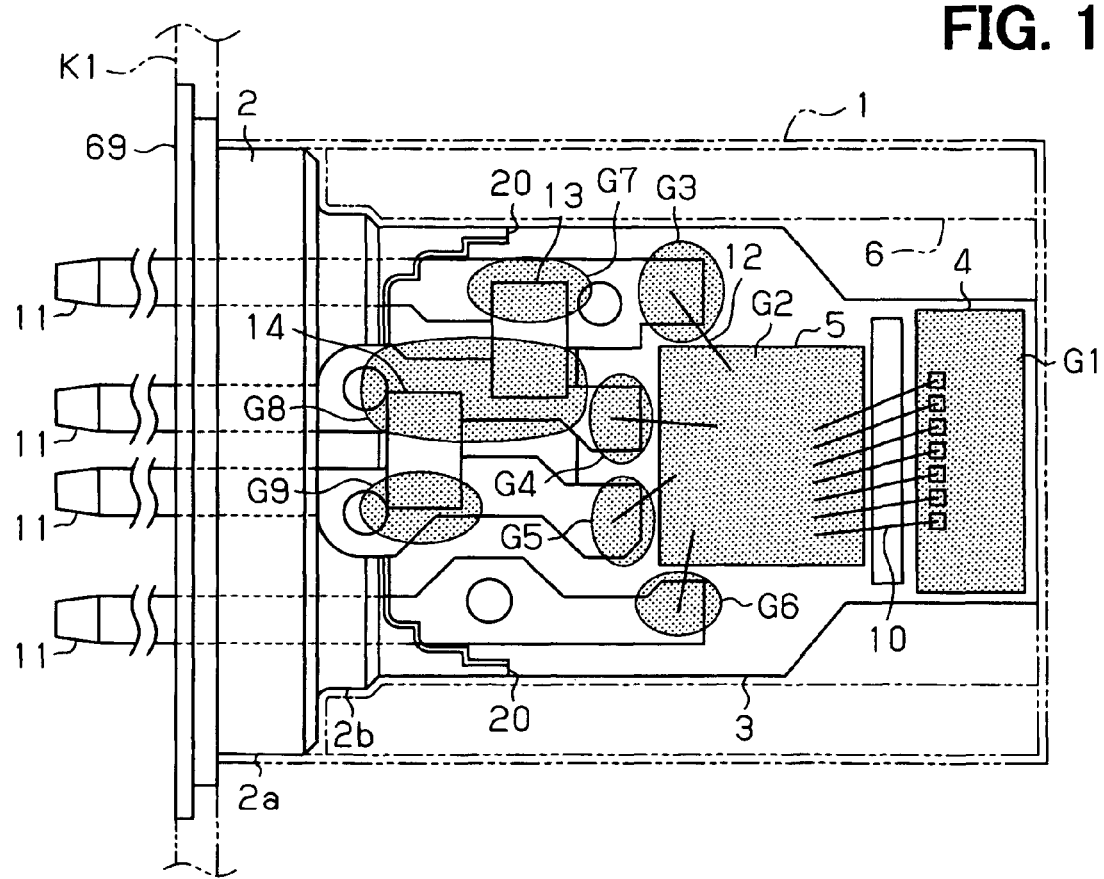
FIG. 19 is a plan view showing a modified form 4 in which a mounting flange is formed on a cover member.
Figure 20:
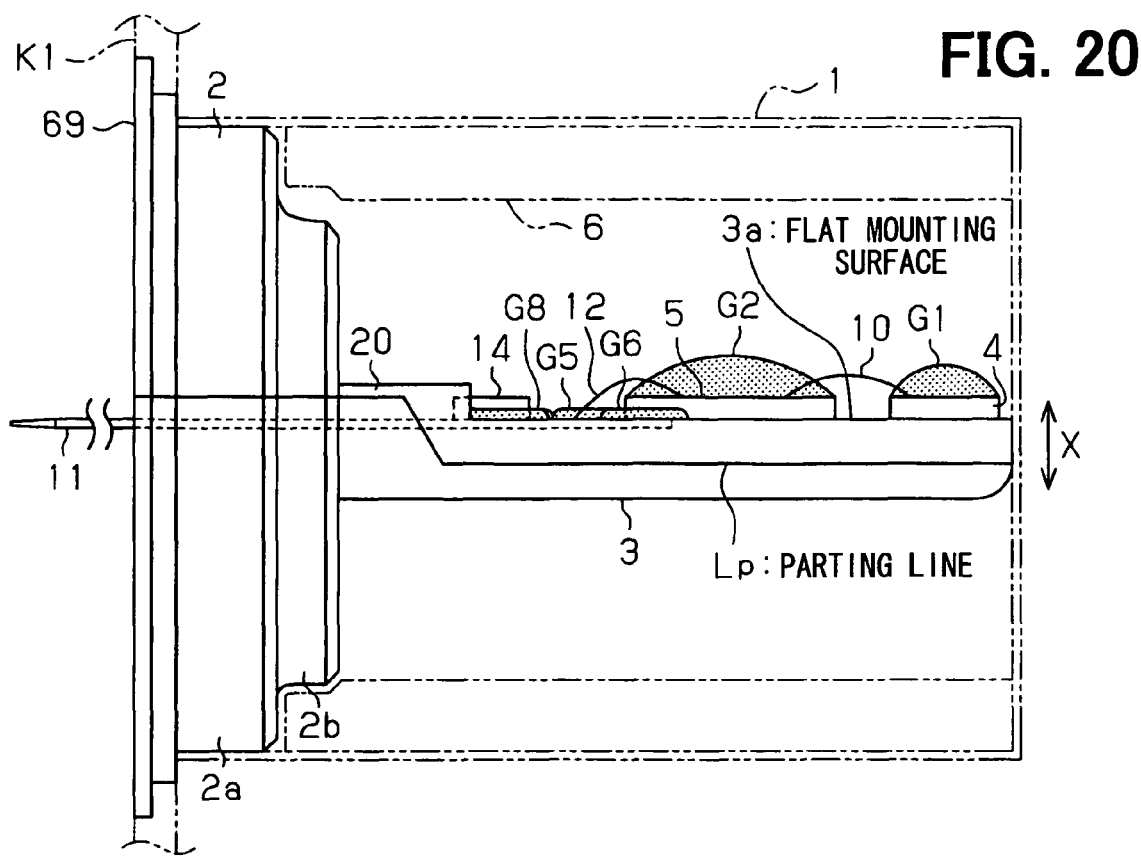
FIG. 20 is a side view showing the modified form 4, indicating a parting line for a molding process.

A modified form 4 will be described with reference to FIGS. 19 and 20, corresponding to FIGS. 8 and 9, respectively. In this modified form 4, a mounting flange 69 having a step is added to the cover member 2. The mounting flange 69 is connected to a plate K1 by laser welding. The mounting plate 3 is integrally molded together with the cover member 2 including the mounting flange 69. In the molding process, a line Lp shown in FIG. 20 is used as a parting line of a molding die. The parting line Lp is positioned apart from the flat surface 3a of the mounting plate 3 by a certain distance in a thickness direction X of the mounting plate 3. By positioning the parting line Lp apart from the flat mounting surface 3a, the gel spread to the edge of the flat mounting surface 3a is prevented from flowing toward the outer periphery of the cover member 2 along the parting line Lp.

Figure 21:
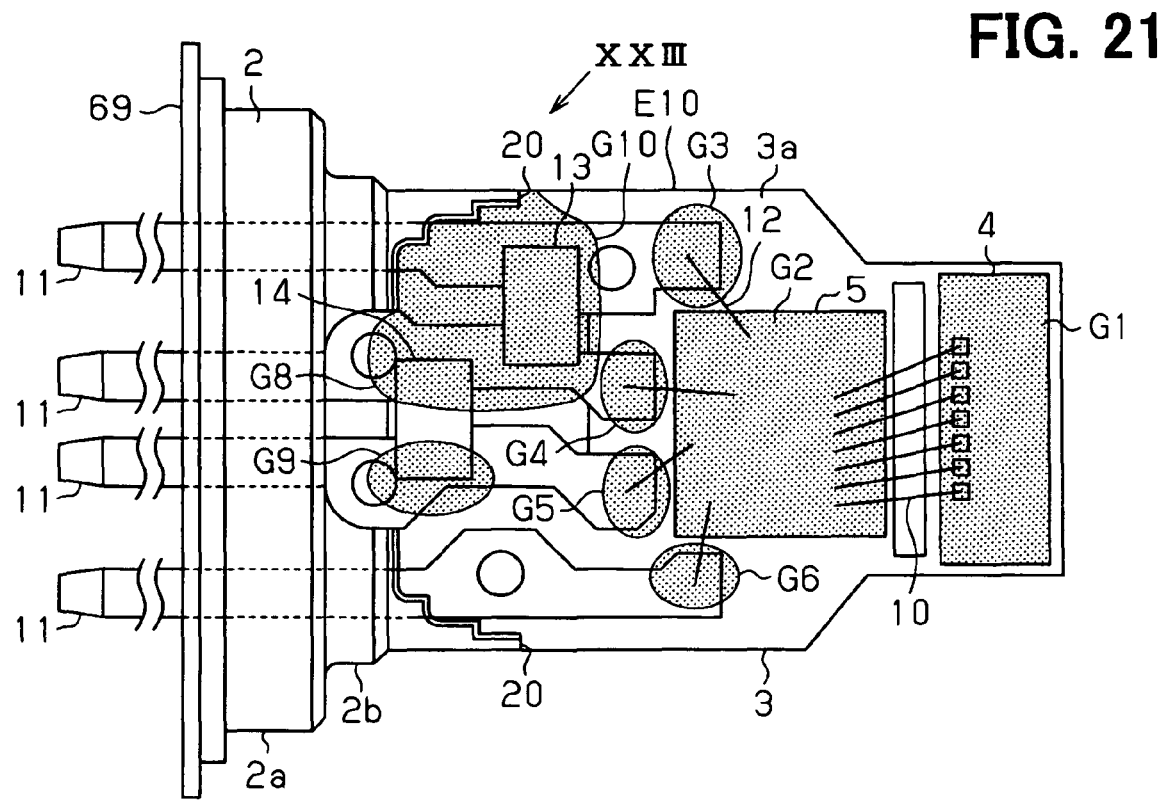
FIG. 21 is a plan view showing the modified form 4 on which the gel is applied.
Figure 22:
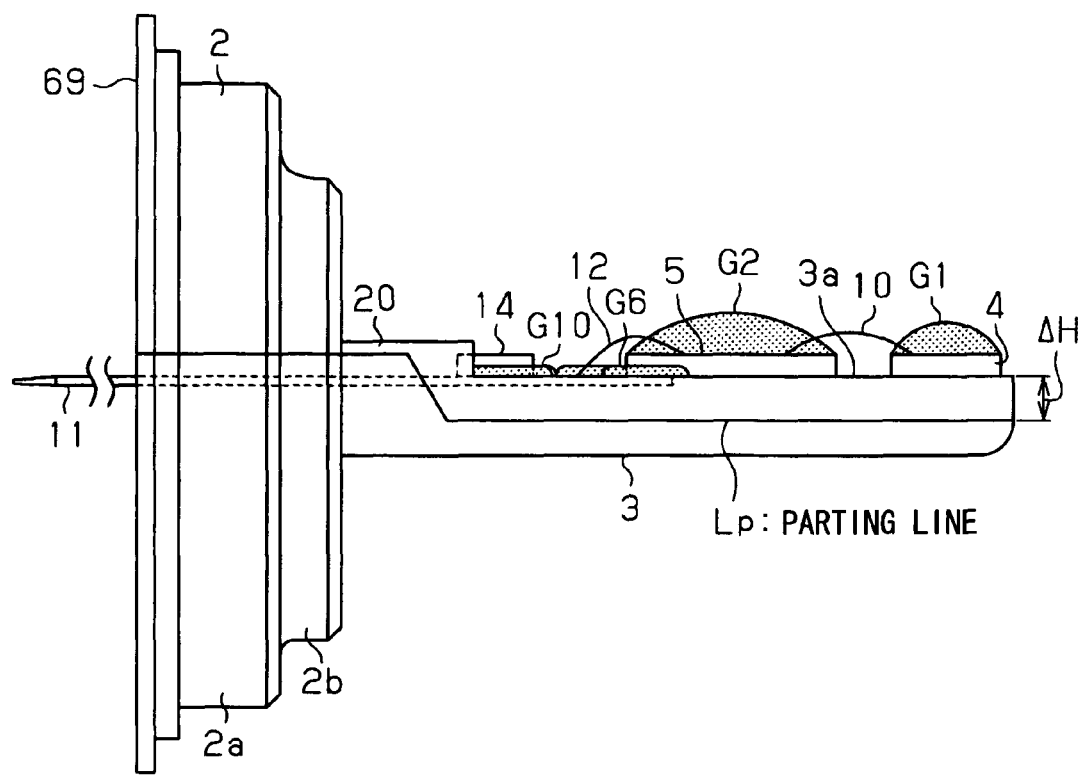
FIG. 22 is a side view showing the modified form 4, indicating a horizontal distance AH between a mounting surface and a parting line.

The reason why the parting line Lp is positioned apart from the flat mounting surface 3a will be further explained with reference to FIGS. 21, 22 and 23. As shown in FIG. 21, the gel spreads to the edge E10 of the flat mounting surface 3a after it is dropped on the components to cover them. Since the parting line Lp is apart from the flat mounting surface 3a, the gel does not flow along the parting line (refer to FIG. 23). The distance ΔH between the parting line Lp and the flat mounting surface 3a in the thickness direction is shown in FIG. 22. It is preferable to make the distance ΔH 0.3 mm or more.

Figure 23:
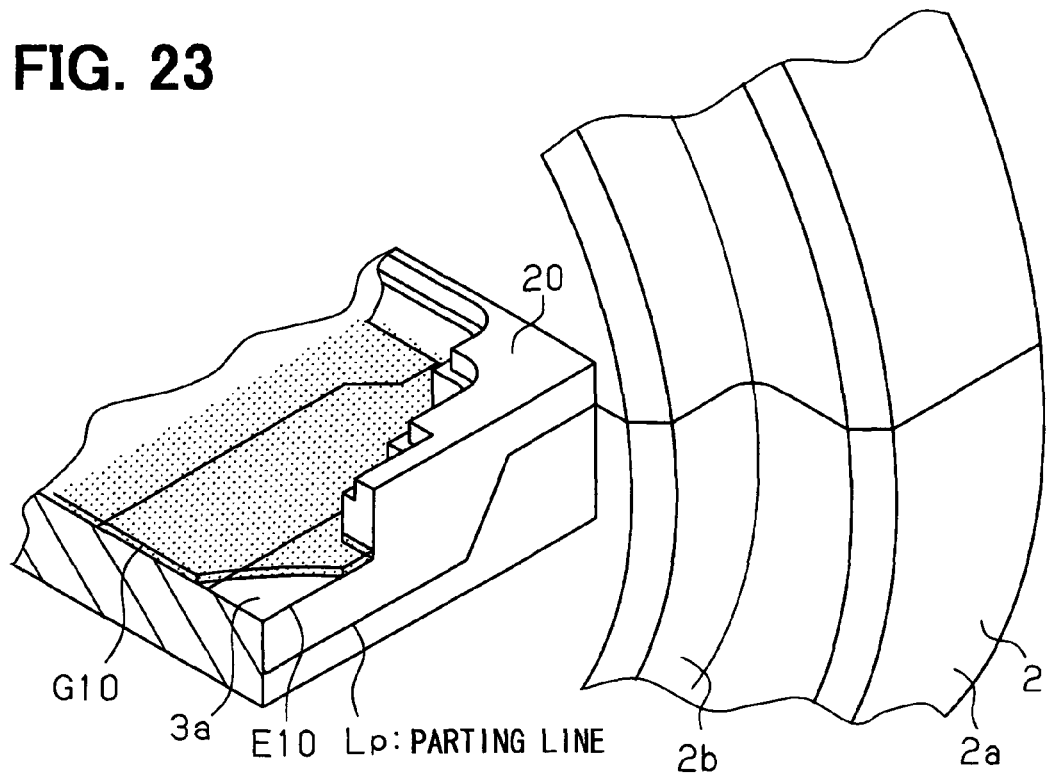
FIG. 23 is a partial perspective view showing the modified form 4, explaining a relation between the mounting surface and the parting line.
Figure 24:
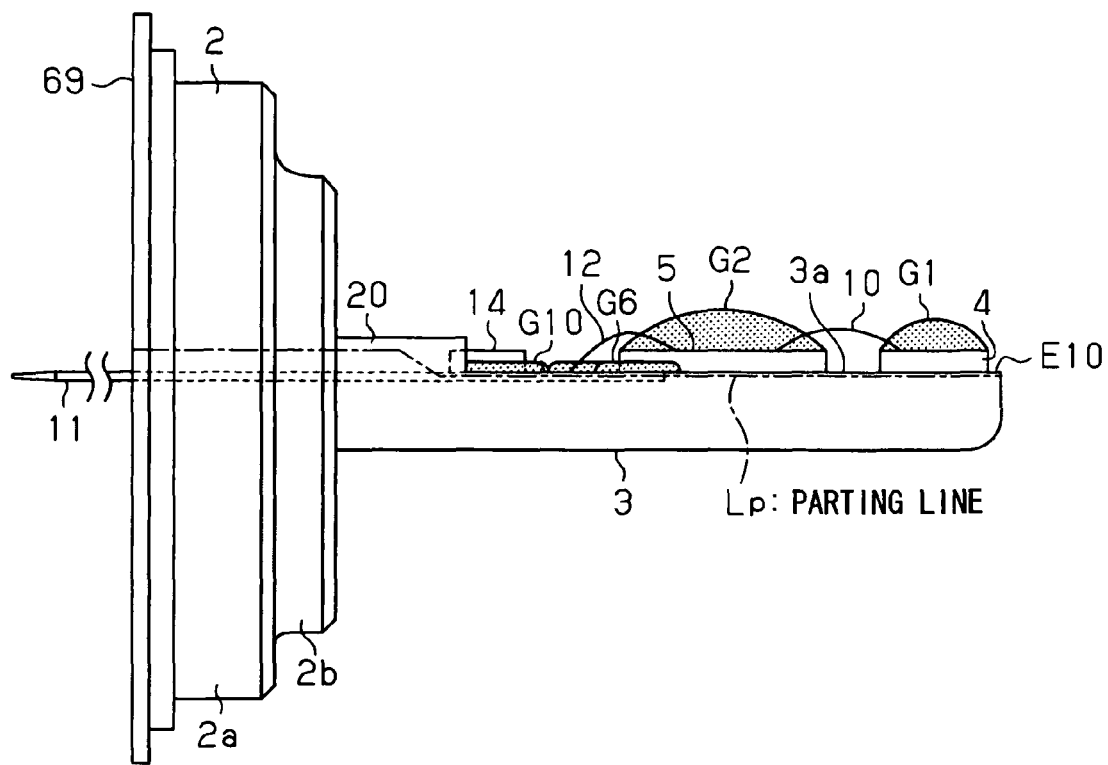
FIG. 24 is a side view showing another comparative example to be compared with the modified form 4 shown in FIG. 22.
Figure 25:
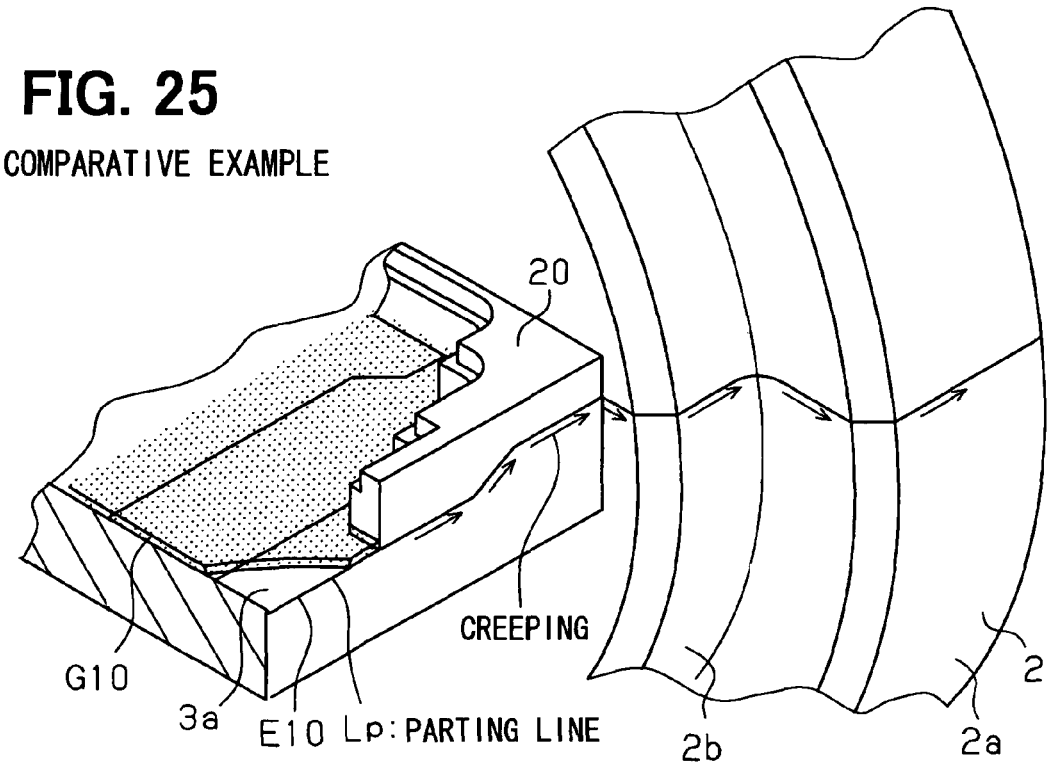
FIG. 25 is the comparative example shown in FIG. 24 to be compared with the modified form 4 shown in FIG. 23.

A comparative example to be compared with the form shown in FIGS. 22 and 23 is shown in FIGS. 24 and 25. In this comparative example, the parting line Lp is positioned along the flat mounting surface 3a (the parting line Lp shown with a chained line is exactly on the flat mounting surface 3a). The gel that has high flowability before it is cured spreads to the edge of the flat mounting surface 3a and flows along the parting line toward the cover member 2, as shown in FIG. 25. This is because small projections, depressions and/or burrs are formed on and along the parting line Lp, and the gel creeps along the parting line by its capillary action. Since the parting line Lp is positioned apart from the flat mounting surface 3a in the modified form 4, the gel is prevented from flowing along the parting line even though the banks 20 are not formed for entirely surrounding the mounting plate 3.

Figure 26:
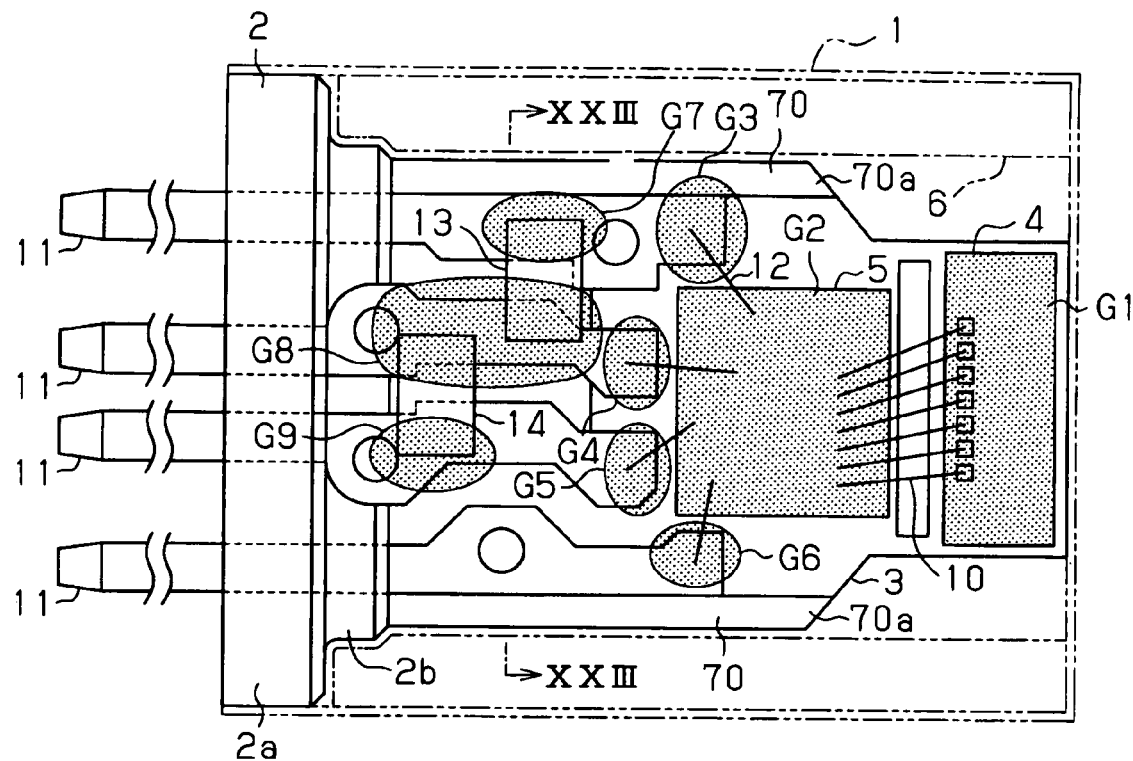
FIG. 26 is a plan view showing a modified form 5 in which a slanted surface is formed on an upper surface of the bank.
Figure 27:
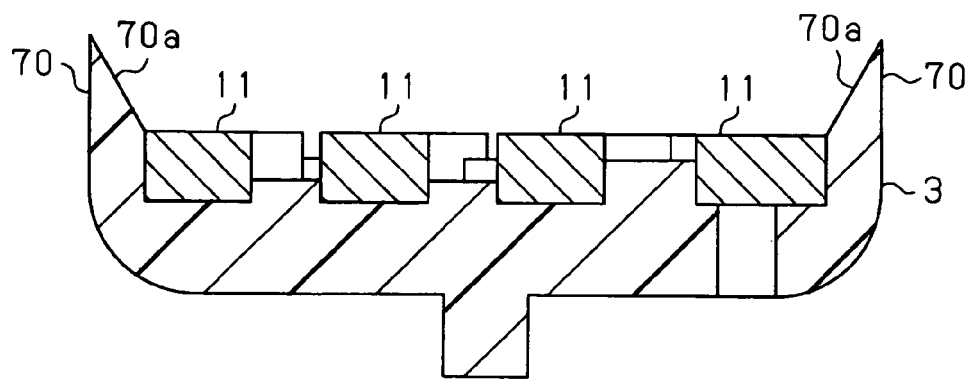
FIG. 27 is a cross-sectional view showing the modified form 5 shown in FIG. 26.

A modified form 5 is shown in FIGS. 26 and 27, which correspond to FIGS. 2 and 5, respectively. In this modified form, banks 70 are formed at both sides of the mounting plate 3 in the same manner as in the foregoing embodiment and modified forms. However, in this modified form 5, the bank 70 has no curved surfaces and depressed portions. Instead, a slanted surface 70a, is formed on the inner wall of the bank 70, as shown in FIG. 27. The flowable gel dropped on the components mounted on the mounting plate 3 is prevented from flowing out toward the cover member 2 by the bank 70 having the slanted surface 70a.

While the present invention has been shown and described with reference to the foregoing preferred embodiment and modified forms, it will be apparent to those skilled in the art that changes in form and detail may be made therein without departing from the scope of the invention as defined in the appended claims.

What is claimed is:

1. A semiconductor sensor comprising:
   a cylindrical housing formed in a cylindrical shape and having a bottom;
   a cover member disposed at an opening of the cylindrical housing for closing the opening;
   a mounting plate contained in the cylindrical housing, extending from the cover member and having a chip mounting flat surface for mounting semiconductor chips thereon;
   a sensing chip mounted on the chip mounting flat surface of the mounting plate in a bare chip state; and
   material having flowablity and disposed on the chip mounting flat surface of the mounting plate,
   wherein banks are formed at both sides of the chip mounting surface of the mounting plate at positions close to the cover member, and
   a curved surface or surfaces in a depressed form are formed on inner walls of the banks.

2. The semiconductor sensor as in claim 1, wherein a depressed portion having surfaces perpendicular to each other is formed further at a corner portion of an inner side of the bank at an end of the bank which is opposite to the cover member.

3. The semiconductor sensor as in claim 1, wherein a groove is formed further on an upper surface of the bank.

4. The semiconductor sensor as in claim 1, wherein a groove is formed further on an outer wall of the bank.

5. The semiconductor sensor as in claim 1, wherein the mounting plate is molded with resin integrally with the cover member, and a parting line is positioned a certain distance apart from the chip mounting surface in a direction of thickness of the mounting plate.

6. The semiconductor sensor as in claim 1, wherein the material having flowability is gel.

7. The semiconductor sensor as in claim 2, wherein a groove is formed further on an upper surface of the bank.

8. The semiconductor sensor as in claim 2, wherein a groove is formed further on an outer wall of the bank.

9. The semiconductor sensor as in claim 2, wherein the mounting plate is molded with resin integrally with the cover member, and a parting line is positioned a certain distance apart from the chip mounting surface in a direction of thickness of the mounting plate.

10. The semiconductor sensor as in claim 2, wherein the material having flowability is gel.

* * * * *